(12) United States Patent
Li et al.

(10) Patent No.: US 11,955,323 B2
(45) Date of Patent: Apr. 9, 2024

(54) DEVICE FOR BLOCKING PLASMA BACKFLOW IN PROCESS CHAMBER TO PROTECT AIR INLET STRUCTURE

(71) Applicant: JIANGSU LEUVEN INSTRUMENTS CO. LTD, Jiangsu (CN)

(72) Inventors: Na Li, Jiangsu (CN); Dongdong Hu, Jiangsu (CN); Xiaobo Liu, Jiangsu (CN); Haiyang Liu, Jiangsu (CN); Shiran Cheng, Jiangsu (CN); Song Guo, Jiangsu (CN); Zhihao Wu, Jiangsu (CN); Kaidong Xu, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 194 days.

(21) Appl. No.: 17/628,224

(22) PCT Filed: Feb. 29, 2020

(86) PCT No.: PCT/CN2020/077316
§ 371 (c)(1),
(2) Date: Jan. 19, 2022

(87) PCT Pub. No.: WO2021/134892
PCT Pub. Date: Jul. 8, 2021

(65) Prior Publication Data
US 2022/0254615 A1 Aug. 11, 2022

(30) Foreign Application Priority Data
Dec. 31, 2019 (CN) .......................... 201911413552.4

(51) Int. Cl.
*H01J 37/32* (2006.01)

(52) U.S. Cl.
CPC .... *H01J 37/32862* (2013.01); *H01J 37/3244* (2013.01); *H01J 2237/335* (2013.01)

(58) Field of Classification Search
CPC ............. H01J 37/32862; H01J 37/3244; H01J 2237/335; H01J 37/32449; C23C 16/45561
(Continued)

(56) References Cited

U.S. PATENT DOCUMENTS

| | | | |
|---|---|---|---|
| 4,270,999 A * | 6/1981 | Hassan | ............... H01J 37/3244 204/192.1 |
| 9,050,556 B1 | 6/2015 | Schieven | |

(Continued)

FOREIGN PATENT DOCUMENTS

| | | |
|---|---|---|
| CN | 106711007 | 5/2017 |
| CN | 107920411 | 4/2018 |
| TW | 200737306 | 10/2007 |

OTHER PUBLICATIONS

"International Search Report (Form PCT/ISA/210) of PCT/CN2020/077316," dated Sep. 10, 2020, with English translation thereof, pp. 1-4.
(Continued)

*Primary Examiner* — Rudy Zervigon
(74) *Attorney, Agent, or Firm* — JCIPRNET

(57) ABSTRACT

The present invention provides a device for blocking plasma backflow in a process chamber to protect an air inlet structure, comprising an air inlet nozzle tightly connected to an air inlet flange. The inner cavity of the air inlet nozzle is provided with an air inlet guide body, wherein the air inlet guide body has an upper structure, a middle structure, and a lower structure, the upper, middle, and lower structures are an integrated structure, the upper, middle, and lower structures are all cylindrical, the cross-sectional diameter of the upper structure is smaller than that of the middle structure,
(Continued)

a gas gathering area is arranged between the middle structure and the lower structure, and the middle structure and the lower structure are connected by the gas gathering area.

9 Claims, 3 Drawing Sheets

(58) Field of Classification Search
USPC .................. 118/715; 156/345.33, 345.34
See application file for complete search history.

(56) References Cited

U.S. PATENT DOCUMENTS

| | | | |
|---|---|---|---|
| 2007/0187363 A1* | 8/2007 | Oka .................. | H01J 37/32449 156/345.33 |
| 2008/0083883 A1* | 4/2008 | Bogart .................. | C23C 16/513 250/423 P |
| 2014/0237840 A1* | 8/2014 | Knyazik ........... | H01J 37/32449 239/522 |
| 2019/0295822 A1 | 9/2019 | Olsen et al. | |
| 2023/0238218 A1* | 7/2023 | Liu .................. | H01J 37/32513 239/553 |

OTHER PUBLICATIONS

"Written Opinion of the International Searching Authority (Form PCT/ISA/237) of PCT/ CN2020/077316," dated Sep. 10, 2020, pp. 1-4.

* cited by examiner

DEVICE FOR BLOCKING PLASMA BACKFLOW IN PROCESS CHAMBER TO PROTECT AIR INLET STRUCTURE

CROSS-REFERENCE TO RELATED APPLICATION

This application is a 371 of international application of PCT application serial no. PCT/CN2020/077316, filed on Feb. 29, 2020, which claims the priority benefit of China application no. 201911413552.4, filed on Dec. 31, 2019. The entirety of each of the above mentioned patent applications is hereby incorporated by reference herein and made a part of this specification.

TECHNICAL FIELD

The present invention relates to the field of plasma etching technology, and more particularly to a device for blocking plasma backflow in a process chamber to protect an air inlet structure.

DESCRIPTION OF RELATED ART

Currently, in order to thoroughly clean a coupling window in the manufacturing process of semiconductor devices, an electrostatic shielding part can be used, where the use of a Faraday shield for a plasma processing chamber can reduce plasma erosion to cavity materials. In the existing technology, a middle ceramic inlet port is connected to the Faraday shield, and an upper radio frequency (radio frequency) is connected at the same time. Thus, through a cleaning process, the coupling window and the middle ceramic inlet port both can be thoroughly cleaned. However, when the radio frequency power is loaded to the maximum, a cleaning gas enters the chamber through an air inlet passage and is ionized inside the chamber under the action of a radio frequency power supply, to form a plasma flow, which then flows back into the air inlet passage through an air inlet hole. Because the air inlet passage is too close to a radio frequency power point, ignition is caused in the air inlet passage, damaging an air inlet guide body. Thus, this method cannot be used.

SUMMARY

To solve the foregoing problem of damage to the air inlet guide body caused by ignition in the air inlet passage because the plasma flows back into the air inlet passage through the air inlet hole, the present invention provides the following technical solution: A device for blocking plasma backflow in a process chamber to protect an air inlet structure is provided, which includes an air inlet nozzle tightly connected to an air inlet flange, an inner cavity of the air inlet nozzle being provided with an air inlet guide body, where:

the air inlet guide body has an upper structure, a middle structure, and a lower structure, where the upper structure, the middle structure, and the lower structure are an integrated structure and are in a shape of cylinder, and the upper structure has a cross-sectional diameter smaller than a cross-sectional diameter of the middle structure; and a gas gathering area is arranged between the middle structure and the lower structure, and the middle structure and the lower structure are connected through the gas gathering area.

Preferably, at least one blind hole is arranged on an upper surface of the air inlet guide body, wherein the blind hole runs through an upper surface of the upper structure into an interior of the middle structure; and a lower end of the blind hole is in communication with one end of a radial hole; and the radial hole is arranged on an upper-outer surface of the middle structure, and another end of the radial hole is in communication with an edge groove; and the edge groove is arranged on outer side surfaces of the middle structure and lower structure.

Preferably, an outer side surface of the upper structure is provided with at least one upper gas groove, the upper gas groove is arranged on the outer side surface of the upper structure, and a bottom of the upper gas groove is connected to one end of the radial groove.

Preferably, another end of the radial groove is connected to a twisted groove, and the twisted groove is a shape of spiral and arranged on the outer side surface of the middle structure.

Preferably, turns of the spiral of the twisted groove has a number of at least 0.5.

Preferably, another of the radial groove is connected to an air-guiding sidewall groove, and the air-guiding sidewall groove is formed by a plurality of air grooves.

Preferably, the air-guiding sidewall groove has at least one air groove inclined to the lower right and at least one air groove inclined to the lower left, and the air groove inclined to the lower right and the air groove inclined to the lower left are connected to each other sequentially in a gas flow direction.

Preferably, the air-guiding sidewall groove has an axial straight air groove, at least one air groove inclined to the lower right, and at least one air groove inclined to the lower left.

Preferably, the axial straight air groove is connected to the other end of the radial groove, and the air groove inclined to the lower left and the air groove inclined to the lower right are connected to each other sequentially in a gas flow direction.

Preferably, the device further includes an insulation protection layer, which is disposed between the air inlet flange and the air inlet guide body.

The present invention has the following beneficial effects:

In the present invention, the electron energy is eliminated, that is, a region closest to an air inlet flange with the radio frequency power is insulated and uncharged. Thus, it is impossible to form a path connected to a high-power part, avoiding damage to an air inlet guide body caused by ignition in an air inlet passage because the plasma flows back into the air inlet passage through an air inlet hole and the air inlet passage is too close to a radio frequency power point.

Meanings of numerals: 6. Coil, 8. Radio frequency matcher, 10. Air inlet flange, 20. Air inlet nozzle, 30. Air inlet guide body, 301. Blind hole, 302. Radial hole, 303. Edge groove, 311. Upper gas groove, 312. Radial groove, 313. Twisted groove, 321. Air groove inclined to the lower left, 322. Air groove inclined to the lower right, 331. Axial straight air groove, 343. Air channel; 40. Gas gathering area, 50. Insulation protection layer, 710. Section

DESCRIPTION OF THE EMBODIMENTS

The technical solutions in the embodiments of the present invention are clearly and completely described in detail below with reference to the accompanying drawings in the embodiments of the present invention.

Figure 1:
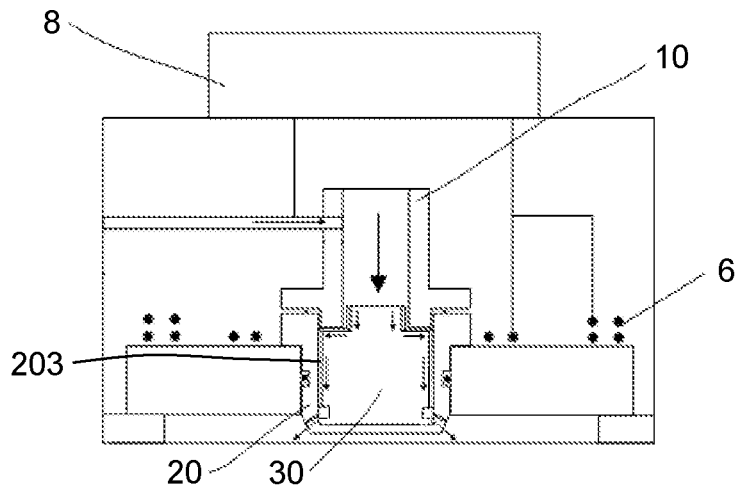
FIG. 1 is a schematic structural diagram of an etching system.
Figure 2:
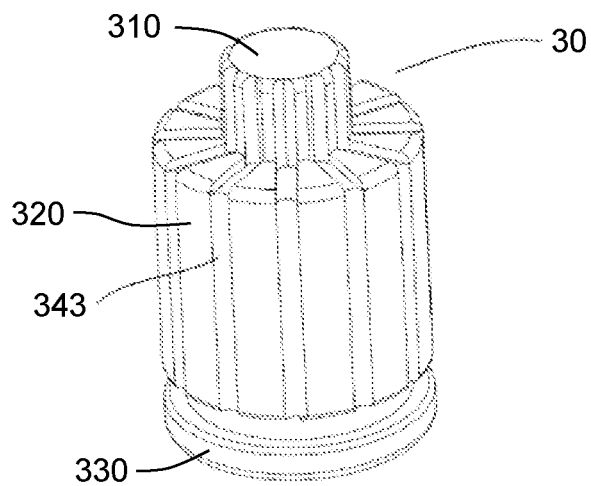
FIG. 2 is a schematic structural diagram of an air inlet guide body in the prior art.

When an etching system shown in FIGS. 1 and 2 requires a cleaning process, connection of an upper radio frequency matcher 8 to a coil 6 is turned off, and a passage to an air inlet flange 10 is connected. Meanwhile, a cleaning gas enters a reaction chamber through the air inlet flange 10 and is ionized into a cleaning plasma flow inside the chamber, to clean the interior and upper area of the chamber. However, because the air inlet flange 10 is connected to a high-power cleaning radio frequency and air channels 343 on an air inlet guide body 30 are in a vertical direction, the plasma produced inside the chamber is likely to flow back into the air channels 343 through an air outlet on the bottom of an air inlet nozzle 20. Further, because the air inlet flange 10 is tightly connected to the upper portion of the air inlet guide body 30, the air channels 343 are communicated with the air inlet flange 10. Then, the gas discharges in this region, so that a high charge is produced inside the air channels 343, burning out the air inlet guide body. To solve the foregoing problem, several technical solutions are proposed below.

Embodiment 1

Figure 3:
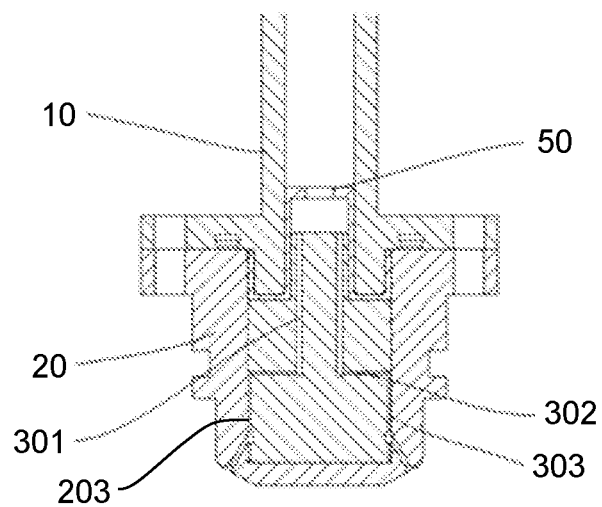
FIG. 3 is a sectional diagram of an air inlet guide body in a first embodiment of the present invention.
Figure 4:
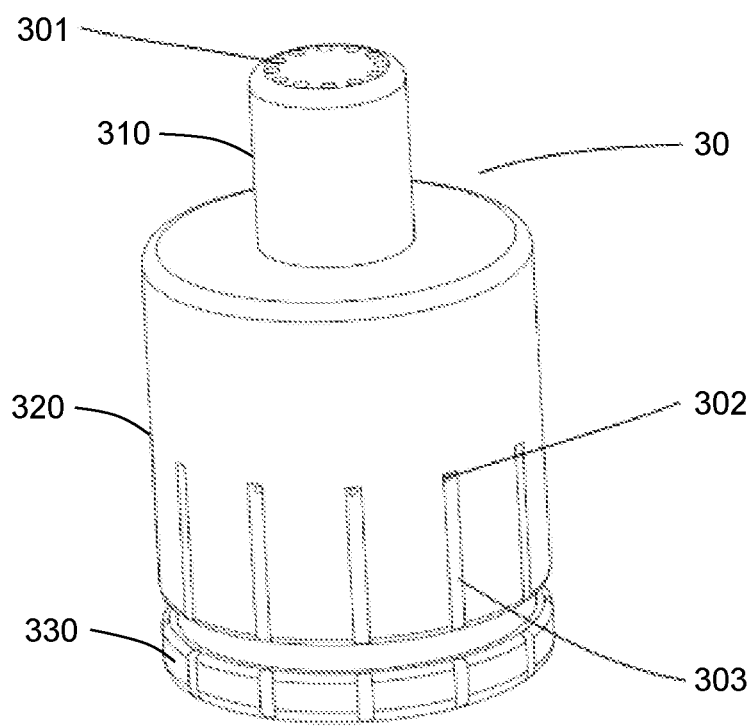
FIG. 4 is a schematic structural diagram of the air inlet guide body in the first embodiment of the present invention.

Referring to FIGS. 3 and 4, a first embodiment provides the following technical solution: A device for blocking plasma backflow in a process chamber to protect an air inlet structure is provided, which includes an air inlet nozzle 20 tightly connected to a metal air inlet flange 10, where an inner cavity of the air inlet nozzle 20 is provided with an air inlet guide body 30; wherein the air inlet guide body 30 has an upper structure, a middle structure, and a lower structure, where the upper, middle, and lower structures are an integrated structure and are all cylindrical, and the cross-sectional diameter of the upper structure is smaller than that of the middle structure; and wherein a gas gathering area 40 is arranged between the middle structure and the lower structure, and the middle structure and the lower structure are connected by the gas gathering area 40.

In order to the solve the problem of damage to the air inlet guide body caused by ignition in an air inlet passage because the plasma flows back into the air inlet passage through an air inlet hole, the upper surface of the air inlet guide body 30 is provided with at least one blind hole 301 in the present invention. A circle of blind holes 301 are provided along the circumference of the upper surface of the upper structure, and run through the upper surface of the upper structure into the middle structure.

The present invention further includes several radial holes 302 and several edge grooves 303. Each of the radial holes 302 is radially arranged on the outer surface of the upper portion of the middle structure, and is communicated with the bottom end of one of the blind holes 301; and the other end of each radial hole 302 is communicated with one of the edge grooves 303.

The edge grooves 303 may be arranged on the outer side face of the middle structure, and end at the gas gathering area 40. As shown in FIG. 4, the edge grooves 303 may also be arranged on the outer side faces of the middle and lower structures, and extend from the middle structure to the lower structure.

An insulation protection layer 50 is disposed between the air inlet flange 10 and the air inlet guide body 30, and wraps the air inlet flange 10. The material of the insulation protection layer 50 is plastic, and is generally polytetrafluoroethylene, polyimide or polyketone. Such a material can realize high-voltage insulation consumption, greatly reducing the damage of the high radio frequency power to the air inlet guide body at the bottom.

When the system is subjected to a cleaning process, a cleaning gas is introduced from the air inlet flange 10; flows through the blind holes 301, the radial holes 302, and the edge grooves 303 on the air inlet guide body 30; and is finally discharged from an air outlet on the bottom of the air inlet nozzle 20. When flowing back through the air outlet, the plasma flow in the chamber needs to enter the edge grooves 303 through the air inlet passage. Because the edge grooves 303 are physically clogged at the top, at this position, the plasma flow is likely to hit the solid walls at the top of the edge grooves 303, and then electrons gradually disappear with the collision energy. That is, a region closest to the air inlet flange 10 with the radio frequency power is insulated and uncharged, and therefore, it is impossible to form a path connected to a high-power part, thus protecting the air inlet guide body 30 from high-heat and high-radio frequency damage.

Embodiment 2

Figure 5:
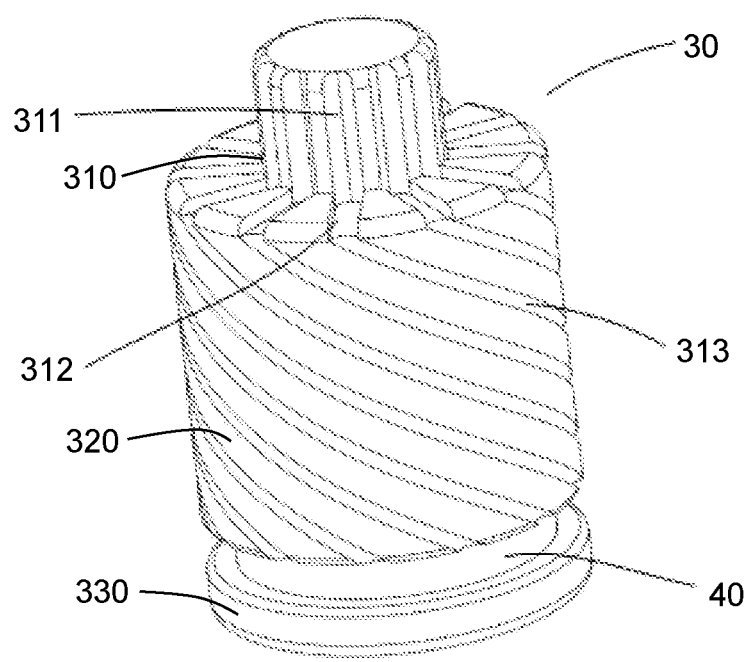
FIG. 5 is a schematic structural diagram of an air inlet guide body in a second embodiment of the present invention.

Referring to FIG. 5, a second embodiment provides the following technical solution: A device for blocking plasma backflow in a process chamber to protect an air inlet structure is provided, which includes an air inlet nozzle 20 tightly connected to a metal air inlet flange 10, where an inner cavity of the air inlet nozzle 20 is provided with an air inlet guide body 30;

wherein the air inlet guide body 30 has an upper structure, a middle structure, and a lower structure, where the upper, middle, and lower structures are an integrated structure and are all cylindrical, and the cross-sectional diameter of the upper structure is smaller than that of the middle structure; and wherein a gas gathering area 40 is arranged between the middle structure and the lower structure, and the middle structure and the lower structure are connected by the gas gathering area 40.

In order to the solve the problem of damage to the air inlet guide body caused by ignition in an air inlet passage because the plasma flows back into the air inlet passage through an air inlet hole, the outer side face of the upper structure is provided with several upper gas grooves 311 in the present invention, and the upper gas grooves 311 are axially arranged on the outer side face of the upper structure, where the bottom of each upper gas groove 311 is connected to one end of one radial groove 312.

The present invention further includes several radial grooves 312 and several twisted grooves 313, where the other ends of the radial grooves 312 are respectively communicated with the twisted grooves 313. The twisted grooves 313 are spirally arranged on the outer side face of the middle structure, and extend to the gas gathering area 40.

The number of turns of the spiral on the twisted groove 313 may be set to 0.5; or may also be adjusted according to the processing difficulty and the pressure of the gas flow in the chamber, and one or more turns of spiral may also be arranged.

An insulation protection layer 50 is disposed between the air inlet flange 10 and the air inlet guide body 30, and wraps the air inlet flange 10. The material of the insulation protection layer 50 is plastic, and is generally polytetrafluoroethylene, polyimide or polyketone. Such a material can realize high-voltage insulation consumption, greatly reducing the damage of the high radio frequency power to the air inlet guide body at the bottom.

When the system is subjected to a cleaning process, a cleaning gas introduced from the air inlet flange 10 flows through the upper gas grooves 311, the radial grooves 312, and the twisted grooves 313, and gathers at the gas gathering area 40; and is finally ejected from an air outlet of the air inlet nozzle 20. When flowing back through the air outlet, the plasma in the chamber reaches the bottom of the twisted grooves 313 via the gas gathering area 40. Because the twisted grooves 313 are oblique, the plasma with electrons collides on the oblique walls of the twisted grooves 313, and then the electrons gradually disappear with the collision energy. Therefore, it is impossible to form a path connected to a high-power part, thus protecting the air inlet guide body 30 from high-heat and high-radio frequency damage.

Embodiment 3

Figure 6:
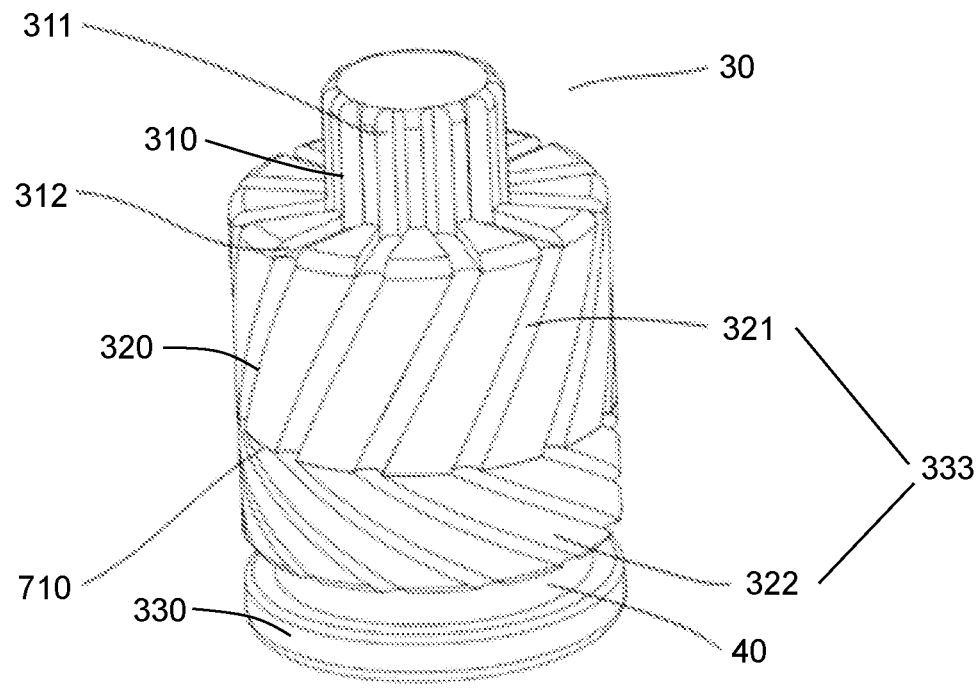
FIG. 6 is a schematic structural diagram of an air inlet guide body in a third embodiment of the present invention.

Referring to FIG. 6, a third embodiment provides the following technical solution: A device for blocking plasma backflow in a process chamber to protect an air inlet structure is provided, which includes an air inlet nozzle 20 tightly connected to a metal air inlet flange 10, where an inner cavity of the air inlet nozzle 20 is provided with an air inlet guide body 30;

wherein the air inlet guide body 30 has an upper structure, a middle structure, and a lower structure, where the upper, middle, and lower structures are an integrated structure and are all cylindrical, and the cross-sectional diameter of the upper structure is smaller than that of the middle structure; and wherein a gas gathering area 40 is arranged between the middle structure and the lower structure, and the middle structure and the lower structure are connected by the gas gathering area 40.

In order to the solve the problem of damage to the air inlet guide body caused by ignition in an air inlet passage because the plasma flows back into the air inlet passage through an air inlet hole, the outer side face of the upper structure is provided with several upper gas grooves 311 in the present invention, and the upper gas grooves 311 are axially arranged on the outer side face of the upper structure, where the bottom of each upper gas groove 311 is connected to one end of one radial groove 312, and the number of the radial grooves 312 is identical with that of the upper gas grooves 311.

The other end of each radial groove 312 is connected to an air-guiding sidewall groove, where the air-guiding sidewall groove is formed by a plurality of air grooves, and has at least one air groove 322 inclined to the lower right and at least one air groove 321 inclined to the lower left. The air groove 322 inclined to the lower right and the air groove 321 inclined to the lower left are connected in sequence in a gas flow direction, and their numbers are adjusted according to the processing difficulty and the pressure of the gas flow in the chamber.

An insulation protection layer 50 is disposed between the air inlet flange 10 and the air inlet guide body 30, and wraps the air inlet flange 10. The material of the insulation protection layer 50 is plastic, and is generally polytetrafluoroethylene, polyimide or polyketone. Such a material can realize high-voltage insulation consumption, greatly reducing the damage of the high radio frequency power to the air inlet guide body at the bottom.

As shown in FIG. 6, the middle structure of the air inlet guide body 30 may be formed by two separate parts, and the air ducts in the two parts are opposite in direction and are divided by a section 710. In a cleaning process of the system, when flowing back through an air outlet, the plasma in the chamber reaches the bottom of the air grooves 322 inclined to the lower right via the gas gathering area 40. Because the air grooves 321 inclined to the lower left and the air grooves 322 inclined to the lower right are oblique, the plasma with electrons collides on the oblique walls of the air grooves 321 inclined to the lower left and the air grooves 322 inclined to the lower right, and then the electron energy gradually disappears. Therefore, it is impossible to form a path connected to a high-power part, thus protecting the air inlet guide body 30 from high-heat and high-radio frequency damage.

Embodiment 4

Figure 7:
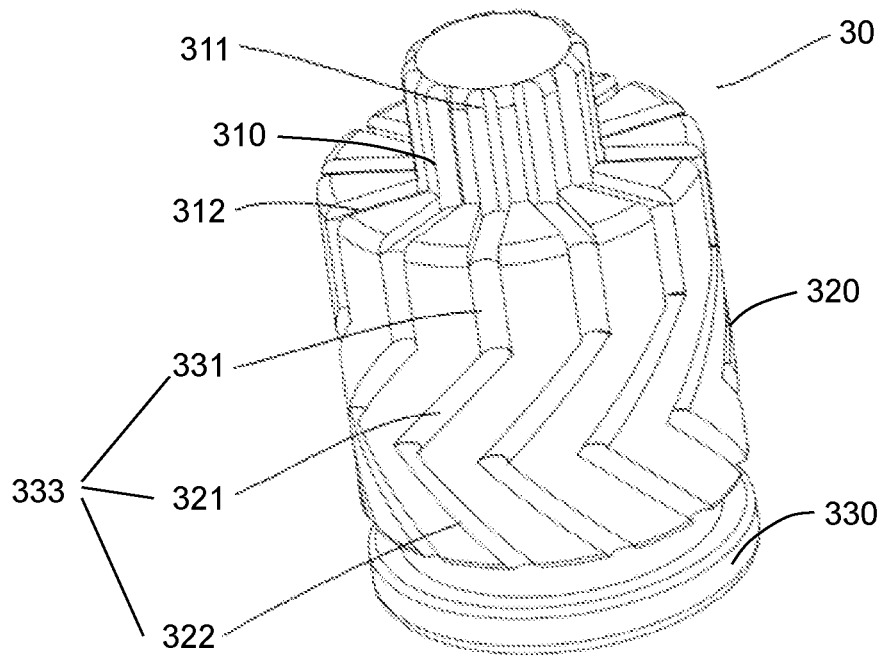
FIG. 7 is a schematic structural diagram of an air inlet guide body in a fourth embodiment of the present invention.

Referring to FIG. 7, a fourth embodiment provides the following technical solution: A device for blocking plasma backflow in a process chamber to protect an air inlet structure is provided, which includes an air inlet nozzle 20 tightly connected to a metal air inlet flange 10, where an inner cavity of the air inlet nozzle 20 is provided with an air inlet guide body 30;

wherein the air inlet guide body 30 has an upper structure, a middle structure, and a lower structure, where the upper, middle, and lower structures are an integrated structure and are all cylindrical, and the cross-sectional diameter of the upper structure is smaller than that of the middle structure; and wherein a gas gathering area 40 is arranged between the middle structure and the lower structure, and the middle structure and the lower structure are connected by the gas gathering area 40.

In order to the solve the problem of damage to the air inlet guide body caused by ignition in an air inlet passage because the plasma flows back into the air inlet passage through the air inlet hole, the outer side face of the upper structure is provided with several upper gas grooves 311 in the present invention, and the upper gas grooves 311 are axially arranged on the outer side face of the upper structure, where the bottom of each upper gas groove 311 is connected to one end of one radial groove 312, and the number of the radial grooves 312 is identical with that of the upper gas grooves 311.

The other end of each radial groove 312 is connected to an air-guiding sidewall groove, where the air-guiding sidewall groove is formed by a plurality of air grooves, and has an axial straight air groove 331, at least one air groove 322 inclined to the lower right, and at least one air groove 321 inclined to the lower left. The axial straight air grooves 331 are connected to the other ends of the radial grooves 312, and the air groove 321 inclined to the lower left and the air groove 322 inclined to the lower right are connected in sequence in a gas flow direction.

An insulation protection layer 50 is disposed between the air inlet flange 10 and the air inlet guide body 30, and wraps the air inlet flange 10. The material of the insulation protection layer 50 is plastic, and is generally polytetrafluoroethylene, polyimide or polyketone. Such a material can realize high-voltage insulation consumption, greatly reducing the damage of the high radio frequency power to the air inlet guide body at the bottom.

As shown in FIG. 7, the air-guiding sidewall groove is formed by several sections, which include the axial straight air groove 331, and the air groove 321 inclined to the lower left and the air groove 322 inclined to the lower right that are opposite in direction. The three-section air duct may be arranged on a complete cylindrical sidewall, or may also be assembled from three separate parts in sequence. In addition, in this embodiment, the numbers of the air grooves 321 inclined to the lower left and the air grooves 322 inclined to the lower right are adjusted according to the processing difficulty and the pressure of the gas flow in the chamber.

In a cleaning process of the system, when flowing back through an air outlet, the plasma in the chamber reaches the bottom of the air grooves 322 inclined to the lower right via the gas gathering area 40. Because the air grooves 321 inclined to the lower left and the air grooves 322 inclined to the lower right are oblique, the plasma with electrons collides on the oblique walls of the air grooves 321 inclined to the lower left and the air grooves 322 inclined to the lower right, and then the electron energy gradually disappears. Therefore, it is impossible to form a path connected to a high-power part, thus protecting the air inlet guide body 30 from high-heat and high-radio frequency damage.

Although the embodiments of the present invention have been shown and described, those of ordinary skill in the art can understand that various changes, modifications, substitutions, and variations can be made to these embodiments without departing from the principle and spirit of the present invention. The scope of the present invention is defined by the appended claims and their equivalents.

What is claimed is:

1. A device for blocking plasma backflow in a process chamber to protect an air inlet structure, comprising an air inlet nozzle connected to an air inlet flange, an inner cavity of the air inlet nozzle being provided with an air inlet guide body, wherein
    the air inlet guide body has an upper structure, a middle structure, and a lower structure, where the upper structure, the middle structure, and the lower structure are an integrated structure and are in a shape of cylinder, and the upper structure has a cross-sectional diameter smaller than a cross-sectional diameter of the middle structure; and
    a gas gathering area is arranged between the middle structure and the lower structure, and the middle structure and the lower structure are connected through the gas gathering area,
    wherein at least one blind hole is arranged on an upper surface of the air inlet guide body, wherein the blind hole runs through an upper surface of the upper structure into an interior of the middle structure; and a lower end of the blind hole is in communication with one end of a radial hole;
    wherein the radial hole is arranged on an upper-outer surface of the middle structure, and another end of the radial hole is in communication with an edge groove; and
    the edge groove is arranged on outer side surfaces of the middle structure and lower structure.

2. The device for blocking plasma backflow in the process chamber to protect the air inlet structure according to claim 1, wherein an outer side surface of the upper structure is provided with at least one upper gas groove, wherein the upper gas groove is arranged on the outer side surface of the upper structure, and a bottom of the upper gas groove is connected to one end of the radial groove.

3. The device for blocking plasma backflow in the process chamber to protect the air inlet structure according to claim 2, wherein another end of the radial groove is connected to a twisted groove, and the twisted groove is a shape of spiral and arranged on the outer side surface of the middle structure.

4. The device for blocking plasma backflow in the process chamber to protect the air inlet structure according to claim 3, wherein turns of the spiral of the twisted groove has a number of at least 0.5.

5. The device for blocking plasma backflow in the process chamber to protect the air inlet structure according to claim 2, wherein another end of the radial groove is connected to an air-guiding sidewall groove, and the air-guiding sidewall groove is formed by a plurality of air grooves.

6. The device for blocking plasma backflow in the process chamber to protect the air inlet structure according to claim 5, wherein the air-guiding sidewall groove has at least one air groove inclined to the lower right and at least one air groove inclined to the lower left, and the air groove inclined to the lower right and the air groove inclined to the lower left are connected to each other sequentially in a gas flow direction.

7. The device for blocking plasma backflow in the process chamber to protect the air inlet structure according to claim 5, wherein the air-guiding sidewall groove has an axial straight air groove, at least one air groove inclined to lower right, and at least one air groove inclined to lower left.

8. The device for blocking plasma backflow in the process chamber to protect the air inlet structure according to claim 7, wherein the axial straight air groove is connected to the other end of the radial groove, and the air groove inclined to lower left and the air groove inclined to lower right are connected to each other sequentially in a gas flow direction.

9. The device for blocking plasma backflow in the process chamber to protect the air inlet structure according to claim 1, further comprising an insulation protection layer, which is disposed between the air inlet flange and the air inlet guide body.

* * * * *